(12) United States Patent
Carter

(10) Patent No.: US 8,370,398 B2
(45) Date of Patent: *Feb. 5, 2013

(54) COMPRESSION AND STORAGE OF COMPUTER AIDED DESIGN DATA

(75) Inventor: Michael B. Carter, Ames, IA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,206

(22) Filed: Aug. 2, 2011

(65) Prior Publication Data

US 2011/0285732 A1   Nov. 24, 2011

Related U.S. Application Data

(63) Continuation of application No. 10/261,162, filed on Sep. 30, 2002, now Pat. No. 8,019,788.

(51) Int. Cl.
*G06F 17/30* (2006.01)

(52) U.S. Cl. ...................................................... 707/802

(58) Field of Classification Search ................... 707/802
See application file for complete search history.

(56) References Cited

U.S. PATENT DOCUMENTS

| | | |
|---|---|---|
| 5,253,078 A | 10/1993 | Balkanski et al. |
| 5,408,542 A | 4/1995 | Callahan |
| 5,426,645 A | 6/1995 | Haskin |
| 5,731,814 A | 3/1998 | Bala |
| 5,825,369 A | 10/1998 | Rossignac et al. |
| 5,841,978 A | 11/1998 | Rhoads |
| 5,842,004 A * | 11/1998 | Deering et al. ............ 345/501 |
| 5,864,342 A | 1/1999 | Kajiya et al. |
| 5,867,166 A | 2/1999 | Myhrvold et al. |
| 5,886,701 A | 3/1999 | Chauvin et al. |
| 5,905,507 A | 5/1999 | Rossignac et al. |
| 6,008,820 A | 12/1999 | Chauvin et al. |
| 6,014,671 A | 1/2000 | Castelli et al. |
| 6,219,064 B1 * | 4/2001 | Kamen et al. ............... 345/582 |
| 6,314,205 B1 * | 11/2001 | Masuda et al. ............. 382/232 |
| 6,324,573 B1 | 11/2001 | Rhoads |
| 6,326,964 B1 | 12/2001 | Snyder et al. |
| 6,542,894 B1 | 4/2003 | Lee et al. |
| 6,850,252 B1 * | 2/2005 | Hoffberg ..................... 715/716 |
| 6,959,110 B1 * | 10/2005 | Danskin et al. ............. 382/166 |
| 7,072,061 B2 | 7/2006 | Blair et al. |
| 7,143,046 B2 | 11/2006 | Babu et al. |
| 7,283,987 B2 | 10/2007 | Cha et al. |
| 7,647,340 B2 | 1/2010 | Van Beek et al. |
| 2002/0001396 A1 | 1/2002 | Rhoads |
| 2002/0112114 A1 | 8/2002 | Blair et al. |

* cited by examiner

*Primary Examiner* — Sheree Brown

(57) ABSTRACT

The size of lightweight JT data files containing CAD data is reduced by employing lossy compression where acceptable for portions of the CAD data, such as 3D geometry data. Dictionary-based lossless compression for the remaining portions is augmented by exploiting common repeated structures for some portions, such as precise Brep data, and compressing separate but similar data, such as all metadata for a given part and all scene graph data, together as a single block. The compressed data is then written in separate, uniquely identified data segments indexed in a table of contents, allowing quick access to any data segment for streaming.

20 Claims, 3 Drawing Sheets

COMPRESSION AND STORAGE OF COMPUTER AIDED DESIGN DATA

This is a continuation of U.S. patent application 10/261,162, filed Sept. 30, 2002, now U.S. Pat. No. 8,019,788, which is hereby incorporated by reference.

TECHNICAL FIELD OF THE INVENTION

The present invention is directed, in general, to data compression and, more specifically, to hybrid lossy and lossless data file compression while permitting streaming or similar custom methods of data retrieving.

BACKGROUND OF THE INVENTION

Some data processing applications, such as computer-aided design (CAD) and similar graphics programs, generate large volumes of data. CAD programs, in particular, produce such cumbersome data files that least a portion of the data is preferably translated into a "lightweight" format for viewing, markup, mockup, styling and analysis operations. For instance, the DirectModel family of CAD applications available from Electronic Data. Systems Corporation of Plano, Tex. employs "JT" files (for the former "Jupiter Toolkit" name, using the file extension) that contain several types of data critical for digital mockup operations, including: three dimensional (3D) geometric representations of CAD parts and assemblages thereof, used for high-speed interactive visualization, picking, approximate measurement, and approximate collision and clash detection; precise boundary representation (Prep) of each CAD part, used for precise measurement and precise collision and clash detection; product manufacturing information (PMI) exported from the original CAD source; and additional textual meta-data exported from the original CAD source.

Enterprises employing such translated lightweight CAD files typically have significant economic resources invested in the processes of producing, coordinating and warehousing the data, along with the substantial physical resources employed, to actually store the data. The demands for storage space increase as, for instance, the automobile and aerospace industries produce more lightweight data and construct ever-larger and/or higher-fidelity assemblies. Therefore making the lightweight files as small as possible, by any practical means available, is of primary concern.

At the same time, however, demands for visualization performance (i.e., image data retrieval and rendering). Streaming, in this context, refers to the ability to continuously load 3D geometric model data without forcing the user to wait. The user can meaningfully interact with a model while the data is being loaded, and without suffering any perceivable performance degradation. Reducing the size of lightweight data files should retain the option of retrieving the contents a piece at a time.

Subject to that constraint, every link in the application chain leading to efficient large-model analysis and visualization wins when the lightweight files become smaller: files become smaller (and fewer disk drives or similar storage media need be purchased), disk access time decreases, network utilization is decreased, and the perceived level of application performance is increased due to quicker loading of model data.

There is, therefore, a need in the art for a system, process and data format providing more compact lightweight CAD data files without substantial degradation of visualization performance.

SUMMARY OF THE INVENTION

To address the above-discussed deficiencies of the prior art, it is a primary object of the present invention to provide, for use in connection with a computer aided design application, a lightweight JT data file format for computer aided design data having a total size reduced by employing lossy compression where acceptable for portions of the CAD data, such as 3D geometry data. Dictionary-based lossless compression for the remaining portions is augmented by exploiting common repeated structures for some portions, as precise Brep data, and compressing separate but similar data, such as all meta-data for a given part and all scene graph data, together as a single block. The compressed data is then written in separate, uniquely identified data segments indexed in a table of contents, allowing quick access to any data segment for streaming.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out she same purposes of she present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect, with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 3B, discussed below, and the various embodiments used to describe the principles of the present invention, in this patent document are by way of illustration only and should not be construed in any way to limit the scope of the invention. Those skilled in the art will understand the principles of the present invention may be implemented in any suitably arranged device.

Figure 1:
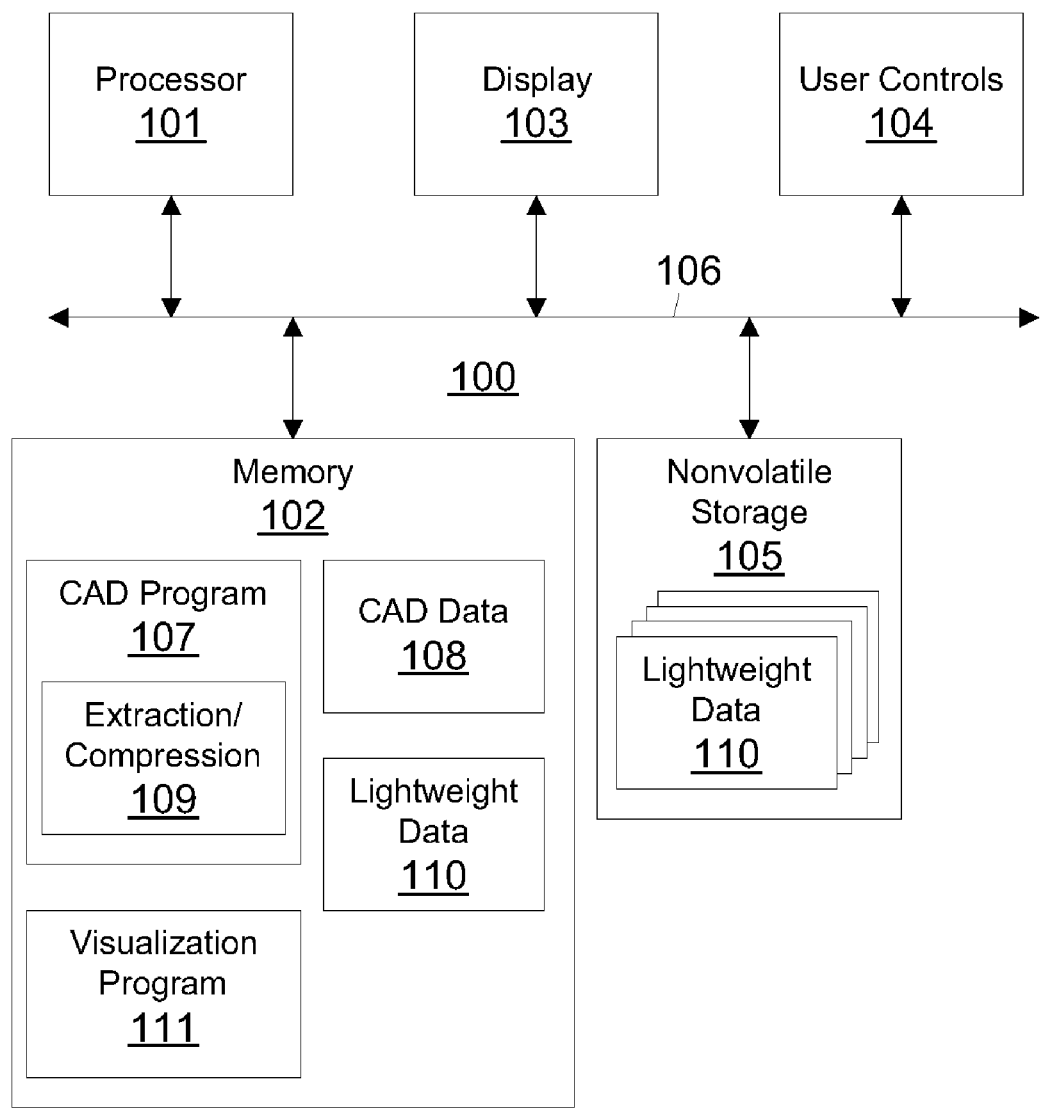
FIG. 1 depicts a data processing system including an application optimizing lightweight data file size without substantial performance degradation according to one embodiment of the present invention.

FIG. 1 depicts a data processing system including an application optimizing lightweight data file size without substantial performance degradation according to one embodiment of the present invention. Data processing system 100 includes: at least one processor 101; memory 102, which may include read only memory (ROM), random access memory (RAM), cache memory, graphics card memory, etc.; at least one display 103; user controls 104, such as a keyboard and a mouse, trackball or similar device; and nonvolatile storage 105, such as a hard disk drive (either local or on a remote network node) as well as, optionally, a read-write optical disk drive.

Processor 101, memory 102, display 103, user controls interconnect 106, such as one or more buses and/or a network connection, which may be a local area network (LAN) connection, an Internet connection, or both, and are interoperable. Data processing system 100 is constructed and operates according known techniques, including a basic input/output system (BIOS), and operating system (OS), and one or more applications or user programs.

Those skilled in the art will recognize that, for simplicity and clarity, the full structure and operation of all data processing systems suitable for use with the present invention is not being depicted or described herein. Instead, only so much of a data processing system as is unique to the present invention or necessary for an understanding of the present invention is depicted and described. The remainder of the construction and operation of data processing system 100 may conform to any of the various current implementations and practices known in the art.

In the present invention, data processing system 100 executes a CAD program 107, preferably one making use of the DirectModel toolkit identified above but alternatively any similar CAD or graphics application. CAD program 107 operates, under user control, on CAD data 108 defining graphic drawings for structures. Integrated into the CAD program is an extraction/compression module 109 for extracting lightweight data 110 from CAD data 108. In alternative embodiments, the extraction/compression functionality of module 109 may be implemented as a separate utility, either operating independently, interoperable with CAD program 107 (e.g., a "plug-in"), or both.

In addition, data processing system 100 also executes a visualization program 111 which can retrieve and decompress lightweight data 110 for rendering and presentation, annotation and other purposes. While CAD programs can read lightweight data 110, generally create the lightweight data 110 from the CAD data 108, the primary customer application for lightweight data 110 involves visualization programs 111, which are therefore more likely to utilize the lightweight data 110 according to the present invention. The lightweight data 110 may be retrieved by visualization, program 111 from local storage or over a network, either a local area network (LAN) or larger network (e.g., the Internet).

Minimizing lightweight data file size may focus on one or both of two aspects: storing only data that is absolutely necessary; and storing the selected data as compactly as possible. The present invention relates to improving the second aspect of minimizing lightweight data file size. Prior versions of the JT file format written by the DirectModel toolkit (e.g., version 6.4 and version 7.0) employ the Zlib public-domain dictionary compression scheme to compress JT lightweight data files, achieving approximately a 2 to 1 overall compression ratio. However, it should be noted that the original JT file format was not designed and laid out with consideration of streaming usage of the data, as described above.

Figure 2:
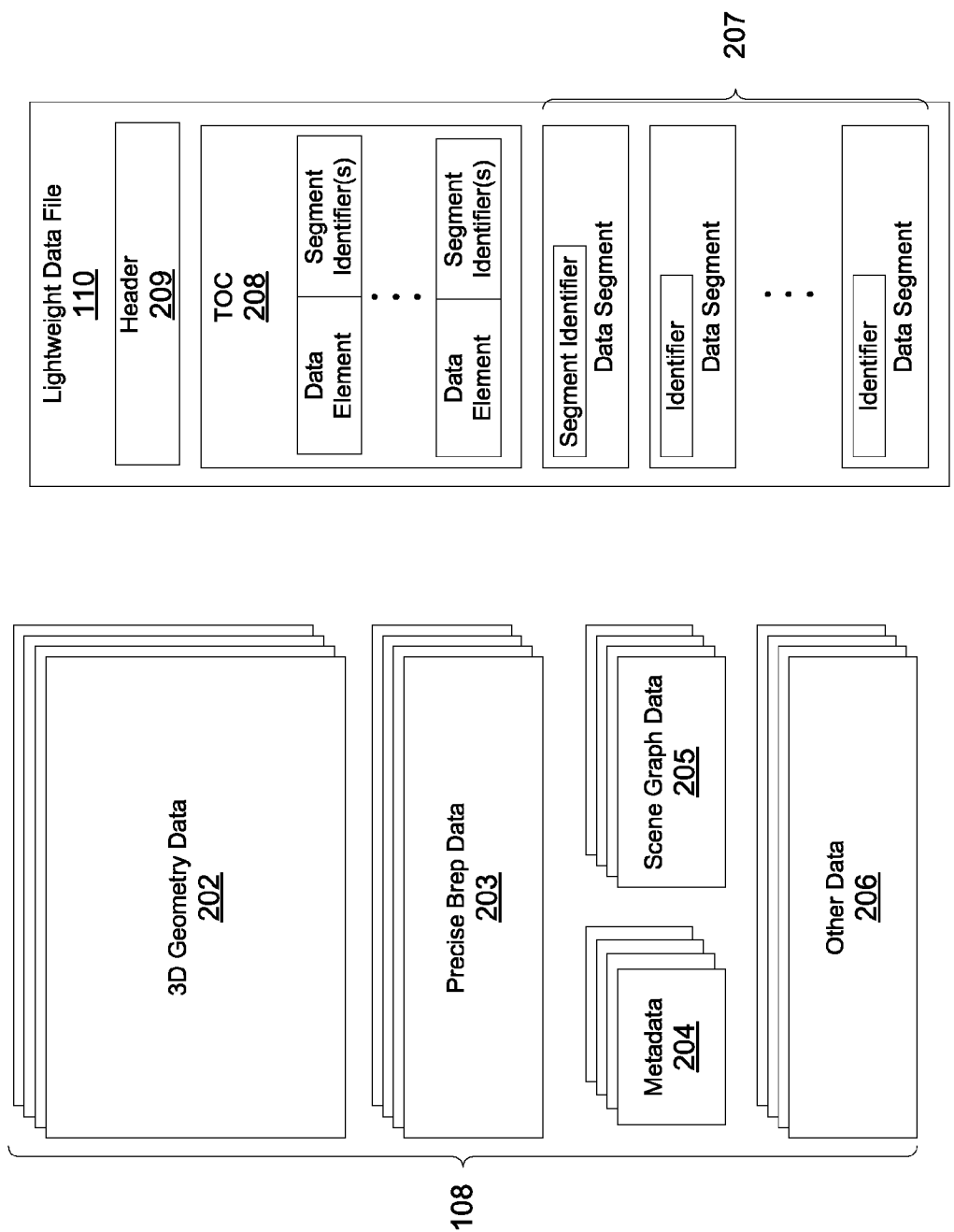
FIG. 2 depicts the structure of lightweight data according to one embodiment of the present invention.

FIG. 2 depicts the structure of lightweight data according to one embodiment of the present invention. A lightweight data file 108 according to the present invention contains selected portions of original CAD data 110, compressed for compact storage.

There are two general classes of data compression: lossless and lossy. In lossless compression, data is exactly preserved through the compression-decompression cycle. DirectModel version 7.0 JT files and "ZIP" files frequently encountered with personal computer applications are examples of lossless compression. In lossy compression, on the other hand, some well-bounded changes to the input, data are allowed so that a greater space savings may be attained. Joint Photographic Experts Group (JPEG) standard image files are examples of lossy compression.

As described above, JT files contain several qualitatively different types of data, including 3D geometric data 202, precise Brep data 203, and textual meta-data 204. In addition, the original data 108 also includes scene graph data 205, as well as other data 206 (including, for example, the PMI data).

As a matter of practice, only the 3D geometry data 202 is amenable to lossy compression; however, this data is the single largest component of most original CAD data 108. In the present invention, a domain-specific combination of quantization, data reorganization, probability modeling, and entropy coding (arithmetic and Huffman) are employed to compress 3D geometry data 202 in a user-adjustable lossy manner.

A lossless Zlib dictionary-based compression scheme is employed for compression of the remaining portions of original. CAD data 108 for which lossy compression is unacceptable. However, the structure of such data is examined and taken into consideration to facilitate optimal compression of such data. In particular, the second largest component of original CAD data 108 is generally the precise Brep data 203, for which lossy compression is not acceptable. However, Brep data 203 often contains common repeated high-level structures which may exploited for more aggressive lossless compression. Accordingly, the Brep data 203 is separately encoded from the remaining portions 204-206 of original CAD data 108, taking advantage of the common repeated high-level structures, data reorganization and entropy coding to reduce the final size of compressed lightweight data 110.

A final compression enhancement for lightweight data 110 relates to the manner in which the remaining data is grouped prior to compression. Metadata 204 and scene graph data 205 is typically sporadically interspersed within CAD data 108, including metadata relating to a single part. Previously, metadata 204 and scene graph data 205 was compressed in small, disjoint chunks, leading to poor compression and an excessive expenditure of processing time. In the present invention, all scene graph data 205 is compressed as a single block, and all metadata 204 for a single part or assembly is compressed as a single block. This grouping leads to better compression, and substantially less processing time during both compression and decompression.

To facilitate streaming, the compressed data within lightweight data file 110 is internally divided into separate and uniquely identified data segments 207, organized by a table of contents (TOC) 208 to allow quick access to any data segment within the file 201. All data segments 207 are uniquely identified across all lightweight data files everywhere. Techniques for uniquely identifying data objects across multiple data processing systems are known in the art. The table of contents 208 should identify, for each data element contained within the lightweight data file 201 (e.g., 3D geometry data, precise Brep data, etc.), the data segment(s) containing such data and either the data type, the compression method employed for the respective data portion, or both.

The unique identification of data segments 207, coupled with the internal segmentation, allows lightweight JT data files to be separated into individual segments for storage and retrieval by other methods, such as a database-driven streaming server. In effect, a lightweight JT data file is only one specific manner in which DirectModel data segments may be packaged. The segments may be stored in any organization—and even mixed and matched with each other—then later safely and unambiguously delivered to the visualization session for which they are intended.

In the exemplary embodiment, lightweight data files 110 contain one table of contents 208 that includes a table associating segment globally unique identifiers (GUIDs) with the location of the segment within the file 110. The TOC entries also contain additional information regarding the segment's length, as well as the basic (but not specific) type of data contained therein. The TOC 208 contains one entry for each segment 207 in the data file 110, with the data file 110 containing one or more segments. In addition to a data payload, each segment 207 has a header containing the segment GUID and total length.

Lightweight data files 110 in the exemplary embodiment also include a file header 207 encoding various attributes, including a file stamp and major/minor version numbers, the location of the table of contents within the file, the GUID of the scene segment, and other flags such as the byte-ordering convention (big-endian versus little-endian) of the system that wrote the file.

Figures 3A, 3B:
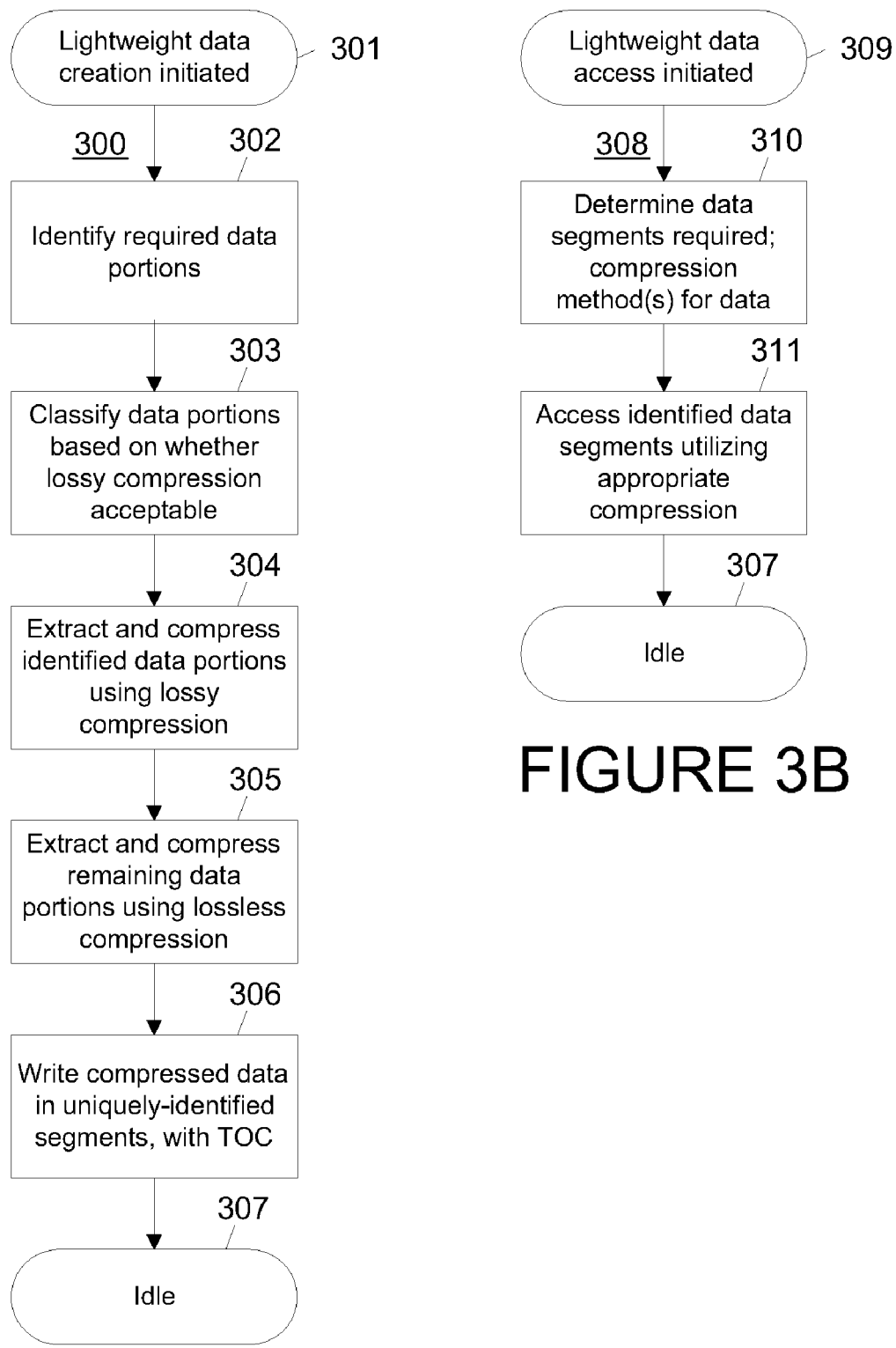
FIGS. 3A and 3B are high-level flowcharts for processes of extracting, compressing and organizing light-weight data files and of accessing lightweight data files according to one embodiment of the present invention.

FIGS. 3A and 3B are high-level flowcharts for processes of extracting, compressing and organizing light-weight data files and of accessing lightweight data files according to one embodiment of the present invention. The processes 300 and 308 are performed by module 109 depicted in FIG. 1, and are implemented in hardware, software (computer program instructions), or a combination thereof.

Process 300 in FIG. 3A, which produces lightweight data files having the structure 201 depicted in FIG. 2, begins with lightweight data file creation from original CAD data being initiated (step 301). The data portions within the original CAD data that are required for the lightweight data file are first identified (step 302), and then classified depending on whether lossy compression is acceptable for each respective data portion (step 303). The optimal lossy compression technique(s) for those data portions for which lossy compression is acceptable are determined, and the relevant data is extracted and compressed by suitable lossy compression methods (step 304).

Optimal loss less compression techniques are then employed to compress the remaining data (step 305), for which lossy compression is unacceptable. In the exemplary embodiment, an ordinary dictionary-based lossless compression scheme is augmented by: (1) exploiting common repeated data structures in some data portions (the precise Brep data), and (2) compressing separate but similar data portions together (all scene graph data, and all metadata for a particular part).

The compressed data is then written in uniquely identified data segments, together with a table of contents (step 306). Identifiers for the data segments are associated with the compressed data element names. Each data segment may contain only one compressed data element, or alternatively portions of two or more compressed data elements. The process then becomes idle (step 307) until creation of another lightweight data file is initiated.

Process 308 in FIG. 3B, which accesses (i.e., reads or writes) lightweight data files having the structure 201 depicted in FIG. 2, begins with lightweight data file access being initiated (step 309) by, for example, a streaming retrieval process, it should be noted that lightweight CAD data may not normally be directly updated (written to), separate from an update of the original CAD data upon which the lightweight data is based. Thus, while lightweight data will often be read without reading the associated original CAD data, updates to the lightweight data are normally associated with updates to the original CAD data except in special circumstances, such as addition of "notes" in the form of metadata by a user analyzing the lightweight data.

The data segments required to complete the access to the lightweight data file are first determined, together with the compression method(s) employed for the data within those segments (step 310). The necessary data segments may be identified from correlation of the unique data segment identifiers with data element names within the table of contents, while the compression method(s) may be determined from the table of contents or based upon the data type of the data elements being accessed (e.g., lossy compression for 3D geometry data, dictionary-based lossless compression for all other data types).

The requested data elements are then accessed utilizing the appropriate compression or decompression methods (step 311), and the process becomes idle (step 312) until another access to the lightweight data file is initiated.

The lightweight JT data format of the present invention, reduces the size of lightweight data files by factor of over previous DirectModel version 7.0 JT files. Customer data thus consumes less than half the server storage required with the version 7.0 JT format, and less than one fifth of the storage required with the DirectModel version 6.4 JT format. This storage savings translates directly into savings for disk storage. In addition, server-based (streaming) large-model viewing performance is increased, providing a more effective visualization and analysis experience for the user.

It is important to note that while the present invention has been described in the context of a fully functional system, those skilled in the art will appreciate that at least portions of the mechanism of the present invention are capable of being distributed in the form of a instructions contained within a machine usable medium in any of a variety of forms, and that the present invention applies equally regardless of the particular type of medium utilized to actually carry out the distribution. Examples of machine usable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An apparatus for creating lightweight data files, comprising:
   data storage in which lightweight computer aided design data elements are selectively stored; and
   a controller coupled to the data storage, the controller configured to
      produce compressed data from the computer aided design data elements by employing lossy compression on three-dimensional geometry data and lossless compression on remaining computer aided design data elements; and
      write the compressed data elements a plurality of separate, uniquely identified data segments within the data storage and indexed by a table of contents, wherein the table of contents identifies each compressed data element and the data segment to each compressed data element is written, thereby creating a lightweight data file.

2. The apparatus of claim 1, wherein the table of contents identifies the data type of each compressed data element.

3. The apparatus of claim 1, wherein the table of contents identifies the compression method used to compress each compressed data element.

4. The apparatus according to claim 1, wherein the controller is configured to provide the data segments for retrieval as a database-driven streaming server.

5. The apparatus according to claim 1, wherein the data segments and table of contents are stored together in a lightweight data file.

6. The apparatus according to claim 1, wherein the table of contents includes a table associating a globally unique identifier with each of the data segments.

7. The apparatus according to claim 6, wherein each data segment has a header containing its globally unique identifier.

8. The apparatus according to claim 1, wherein the table of contents includes information regarding the length of each data segment.

9. The apparatus according to claim 1, wherein each data segment has a header containing its total length.

10. The apparatus according to claim 1, wherein a lossless Zlib dictionary-based compression process is used for the lossless compression.

11. A method performed by a controller, comprising:
    accessing a data storage in which lightweight computer aided design data elements are selectively stored;
    producing compressed data from the computer aided design data elements by employing lossy compression on three-dimensional geometry data and lossless compression on remaining computer aided design data elements; and
    writing the compressed data elements a plurality of separate, uniquely identified data segments within the data storage and indexed by a table of contents, wherein the table of contents identifies each compressed data element and the data segment to each compressed data element is written.

12. The method of claim 11, wherein the table of contents identifies the data type of each compressed data element.

13. The method of claim 11, wherein the table of contents identifies the compression method used to compress each compressed data element.

14. The method of claim 11, wherein the controller is configured to provide the data segments for retrieval as a database-driven streaming server.

15. The method of claim 11, wherein the data segments and table of contents are stored together in a lightweight data file.

16. The method of claim 11, wherein the table of contents includes a table associating a globally unique identifier with each of the data segments.

17. The method of claim 16, wherein each data segment has a header containing its globally unique identifier.

18. The method of claim 11, wherein the table of contents includes information regarding the length of each data segment.

19. The method of claim 11, wherein each data segment has a header containing its total length.

20. A non-transitory machine usable medium storing instructions that, when executed, cause a controller to:
    access a data storage in which lightweight computer aided design data elements are selectively stored;
    produce compressed data from the computer aided design data elements by employing lossy compression on three-dimensional geometry data and lossless compression on remaining computer aided design data elements; and
    write the compressed data elements a plurality of separate, uniquely identified data segments within the data storage and indexed by a table of contents, wherein the table of contents identifies each compressed data element and the data segment to each compressed data element is written.

* * * * *